(12) United States Patent
Metje et al.

(10) Patent No.: US 7,391,621 B2
(45) Date of Patent: Jun. 24, 2008

(54) ELECTRONIC DEVICE

(75) Inventors: Wolfgang Metje, Springe (DE); Nicolaas Johannes Damstra, Breda (NL)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 11/591,655

(22) Filed: Nov. 1, 2006

(65) Prior Publication Data

US 2007/0103881 A1 May 10, 2007

(30) Foreign Application Priority Data

Nov. 4, 2005 (DE) .................... 10 2005 053 108

(51) Int. Cl.
*H05K 7/12* (2006.01)
(52) U.S. Cl. .................. 361/801; 361/759; 361/740; 361/756; 361/796
(58) Field of Classification Search ............. 361/801, 361/726, 732, 740, 747, 756, 759, 796
See application file for complete search history.

(56) References Cited

U.S. PATENT DOCUMENTS

| | | | |
|---|---|---|---|
| 3,853,379 A * | 12/1974 | Goodman et al. | 439/261 |
| 5,996,962 A | 12/1999 | Chang et al. | |
| 6,185,104 B1 * | 2/2001 | Obermaier | 361/759 |
| 6,220,887 B1 * | 4/2001 | Downs | 439/377 |
| 6,256,191 B1 * | 7/2001 | Curlee | 361/683 |
| 6,396,685 B1 * | 5/2002 | Chien | 361/683 |
| 6,442,037 B1 * | 8/2002 | Boe | 361/759 |
| 6,618,263 B1 | 9/2003 | Kin-Wing et al. | |
| 6,970,363 B2 * | 11/2005 | Bassett et al. | 361/801 |

FOREIGN PATENT DOCUMENTS

| | | |
|---|---|---|
| DE | 1903057 | 4/1964 |
| DE | 30513328 | 4/1964 |
| DE | 29912419 | 12/1999 |
| DE | 2991241901 | 12/1999 |

OTHER PUBLICATIONS

Search Report Dated Jul. 7, 2006.

* cited by examiner

*Primary Examiner*—Tuan Dinh
*Assistant Examiner*—Dameon E Levi
(74) *Attorney, Agent, or Firm*—Joseph J. Laks; Harvey D. Fried; Patricia Verlangieri

(57) ABSTRACT

In an electronic device printed circuit boards in a housing are kept parallel to each other by guiding means. One or a plurality of these printed circuit boards is connected with a housing part each on their corresponding edge by means of electronic plug-in connections. To secure the electronic plug-in connections, spring means are provided which exert pressure on opposite edges of the printed circuit boards in the direction of the plug-in connection.

10 Claims, 3 Drawing Sheets

ELECTRONIC DEVICE

This application claims the benefit, under 35 U.S.C. § 119 of German Patent Application 102005053108.3, filed Nov. 4, 2005.

FIELD OF THE INVENTION

The invention relates to an electronic device according to the generic part of claim 1.

In such an electronic device, printed circuit boards are kept parallel to each other in a housing by guiding means. One or a plurality of these printed circuit boards is provided on their edges with plug-in elements which form electronic plug-in connections together with their counterparts arranged on another printed circuit board. This other printed circuit board is fastened to a housing part, mostly to the bottom of the housing. That means, the printed circuit boards are each connected at their corresponding edges with this housing part by means of electronic plug-in connections.

One problem of these plug-in connections is that they might come loose, for example in case of vibrations. This applies especially for multi-pin electronic plug-in connections with 120 and more poles in which the contact length of the plug-in elements is one millimeter or little more.

BACKGROUND OF THE INVENTION

Guiding means known to the Applicant which are provided between the printed circuit boards and which enable parallel arrangements cannot prevent the plug-in connections from loosening in case of vibrations. The applicant also knows separate safeguarding elements by means of which the electronic plug-in connections are secured. However, such safeguarding elements will require space between the printed circuit boards which is not available in a compact parallel arrangement.

SUMMARY OF THE INVENTION

There remains a need for an electronic device providing secure electronic plug-in connections with a compact parallel arrangement of the printed circuit boards. Loosening of the plug-in connections should be avoided—for example, in case of vibrations.

According to the invention, the electronic device is provided with spring means which apply force to the printed circuit boards (1) and press them into their corresponding plug-in connections. Mechanical tolerances will be balanced out by the elasticity of the spring means. Due to the fact that the spring means will engage on the opposite edges, the printed circuit boards can be kept in a very compact parallel arrangement.

Advantageous embodiments are described in the subclaims.

The spring means can be fastened to the opposite housing part, i.e. to the housing part which is opposite to that with the electronic plug-in connections and provided in front of the opposite edges of the printed circuit boards. Upon fastening the opposite housing part with the spring means to the rest of the housing, the printed circuit boards are automatically pressed into the direction of the electronic plug-in connections and held in this position. This is a simple installation of the spring means.

The spring means can be provided with a spring element for each of the printed circuit boards with a plug-in connection. This will allow each printed circuit board to be pressed individually in the direction of the electronic plug-in connections. Differences due to mechanical tolerances can thus be balanced out—for example, due to tolerances in the size of the printed circuit boards.

The guiding means can also be provided on the opposite edges. Since the printed circuit boards are automatically guided on their one side, i.e. on the edges with the electronic plug-in connections, parallel guiding of the printed circuit boards will be optimized by an arrangement of the guiding means on the opposite side, i.e. on the opposite edges.

The guiding means can also be fastened to the opposite housing part to keep the printed circuit boards in parallel arrangement during operation. This will further simplify the installation.

The spring means can comprise at least one leaf spring with a fastening section and with a spring section. The spring section is subdivided into a number of spring elements which is equivalent to the number of printed circuit boards with electronic plug-in connections.

The guiding means can comprise at least one guiding strip provided with grooves for the printed circuit boards.

The spring means and the guiding means can be jointly fastened to the opposite housing part. The fastening section of the leaf spring can be fastened—together with the guiding strip—to the opposite housing part. In the installation of this housing part, the spring means and the guiding means will automatically take up their correct position. Further mechanical adjustments are not necessary. The installation is further simplified.

Two arrangements can be provided spaced apart from each other, each comprising one leaf spring and one guiding strip. This will improve the parallel guidance of the printed circuit boards and also provide more uniform pressure on the printed circuit boards in the direction of the electronic plug-in connections.

An electronic device according to the invention can comprise a connecting part by means of which a detachable electronic connection can be provided to another electronic device. Preferably, the connecting part is provided on the housing part with the plug-in connections. In a simple manner, this will allow to provide—via the connecting part—an electronic connection between at least one of the electronic plug-in connections and the additional electronic device.

Preferably, the electronic device is designed as a recording device, especially as a detachable recording device for a camera.

The invention will be explained in more detail on the basis of an embodiment schematically shown in the drawing, namely on the basis of an electronic device which is designed as a detachable recording device for a camera.

DETAILED DESCRIPTION OF PREFERRED EMBODIMENTS

Figure 1:
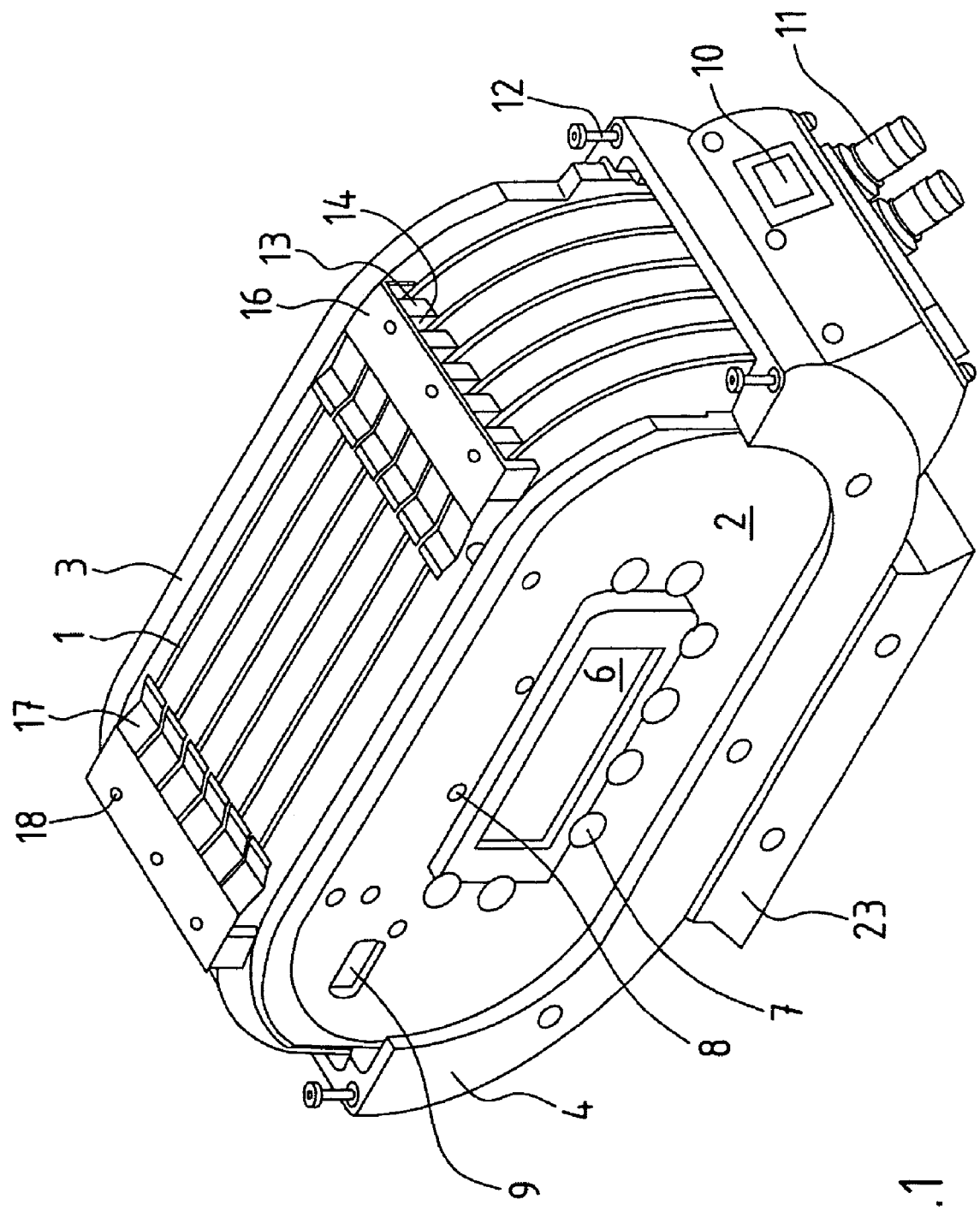
FIG. 1 shows the recording device without an upper housing part opposite the electronic plug-in connections, and provided with spring means as well as guiding means.

An electronic device according to the invention is designed as a detachable recording device for a camera, especially for a professional television camera.

The electronic device comprises a housing in which the printed circuit boards 1 are arranged parallel to each other. In this embodiment, six printed circuit boards 1 are provided which each have the form of an elongated oval shape. The housing is accordingly also oval in shape. The housing shown in the Figures comprises a front housing part 2, a rear housing part 3, a lower housing part 4 and an upper housing part 5. The lower housing part 4 forms a bottom and the lower halves of the sides; and the upper housing part 5 forms a cover and the upper halves of the sides of the housing.

The front housing part 2 is designed as a front plate with a display 6, switches 7, light-emitting diodes 8 and a receiving diode 9, e.g. for a remote control. It is connected with the front printed circuit board 1.

A lateral projection of the lower housing part 4 which is shown on the right side of the housing in FIG. 1 comprises a switch 10 and external connections 11. Other such or similar function elements can be provided. The different housing parts are connected with each other by means of screws 12. The length of the housing is approximately 240 mm, its height approximately 140 mm and its width approximately 90 mm.

The Figures in the drawing do not show that the printed circuit boards 1 are connected on their lower edges by means of electronic plug-in connections with a housing part, namely with the lower housing part 4. To this end, the printed circuit boards 1 comprise, on their edges, plug-in elements which jointly form electronic plug-in connections with their counterparts arranged on another printed circuit board. This other printed circuit board is fastened on the lower housing part 4.

The electronic device comprises guiding means designed as guiding strips 13 by means of which the printed circuit boards 1—in assembled condition as seen in FIG. 1—are kept in their parallel arrangement. Each guiding strip 13 is provided with a groove 14 for every printed circuit board 1 and arranged on the upper edges of the printed circuit boards 1 opposite the plug-in connections.

Guiding strip 13 has the form of an elongated cuboid which is subdivided by grooves 14, like a comb, on its side facing the printed circuit boards 1. Guiding strip 13 in its assembled condition is seated on the upper edges—projecting into grooves 14—of the printed circuit boards 1.

In its length, the guiding strip 13 extends perpendicularly to the course of the printed circuit boards 1 over all upper edges of the printed circuit boards 1 and beyond, to the vicinity of the front and rear housing part 2, 3. The width of the guiding strip 13 is approximately 12 mm.

Except for a tolerance of a few tenths millimeters, the width of grooves 14 is equivalent to the gauge of the printed circuit boards 1. Grooves 14 are approximately 4 to 8 mm deep. The distance between the parallel printed circuit boards 1 and thus—except for the tolerance—the distance between the grooves 14 is also approximately 4 to 8 mm. The printed circuit boards 1 have a gauge of approximately 1.8 to 2 mm. Guiding strips 13 are made of an electronically insulating material—of plastic, for example.

Figure 2:
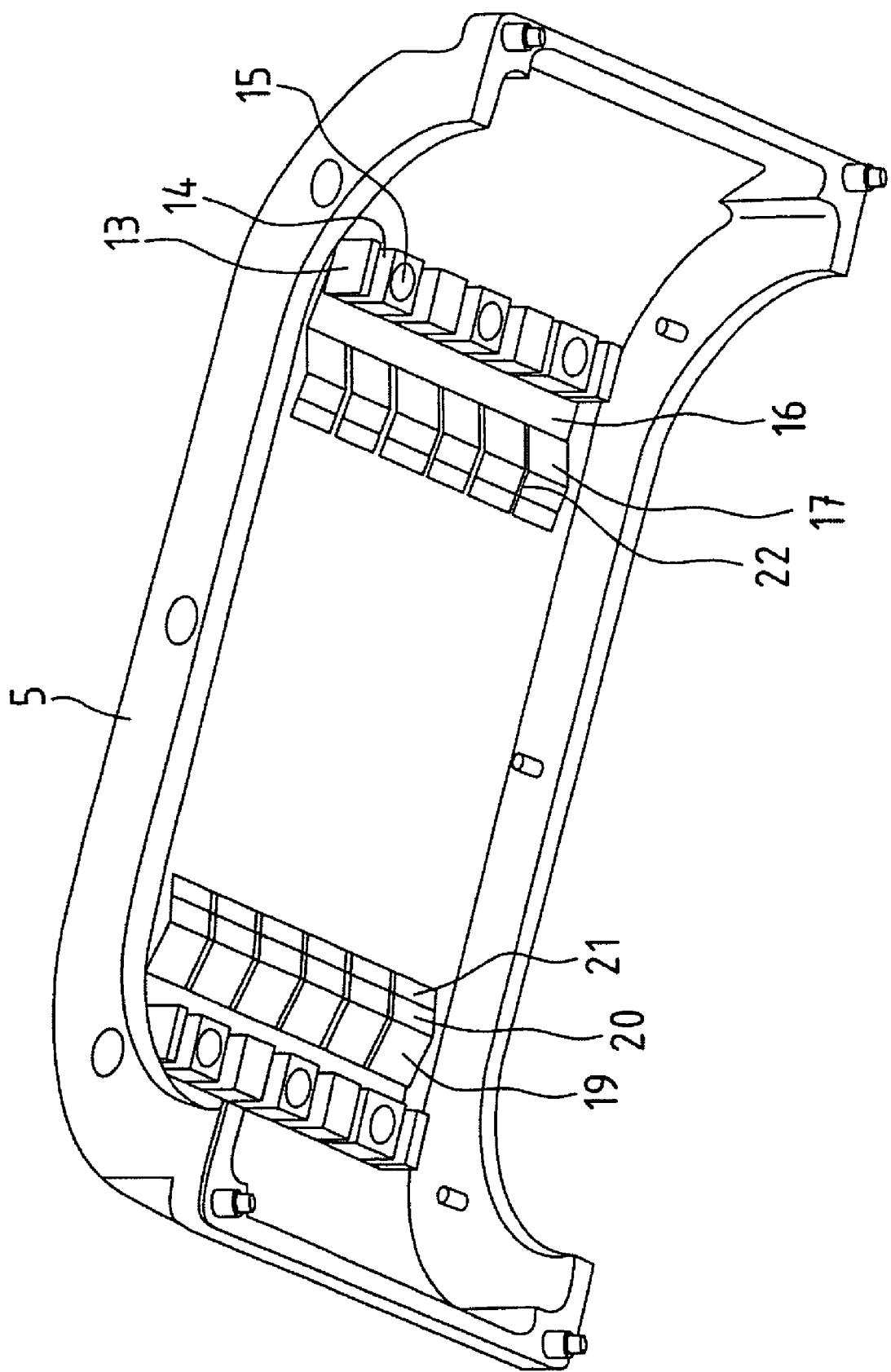
FIG. 2 shows the upper housing part with the spring means and with the guiding means.

In the areas between grooves 14, FIG. 2 shows three screw holes 15 running parallel to the grooves 14. The guiding strips 13 are screwed onto the upper housing part 5 opposite the electronic plug-in connections—by means of screws not shown in the drawing.

The electronic device furthermore comprises spring means designed as leaf springs which, in assembled condition, are arranged on the edges of the printed circuit boards 1 opposite the plug-in connections and which exert pressure on the boards in the direction of the plug-in connections. That means, the leaf springs are arranged—like the guiding strips 13—on the upper edges of the printed circuit boards 1.

Each leaf spring comprises a fastening section 16 and a spring section which is subdivided into the spring elements 17. The number of the spring elements 17 is equivalent to the number of the printed circuit boards 1. For every printed circuit board 1, a separate spring element 17 will be provided.

Their length 1 parallel to the printed circuit boards 1 is approximately double that of its width b. The width B of the leaf spring perpendicular to the printed circuit boards 1 is equivalent to the length of the guiding strip 13.

The fastening section 16 of the leaf spring is flat. In the fastening section 16, the leaf spring is provided with openings 18—three in this embodiment—by means of which the leaf spring is fastened to the opposite housing part, i.e. the upper housing part 5, by means of screws not shown in the drawing.

Figure 3:
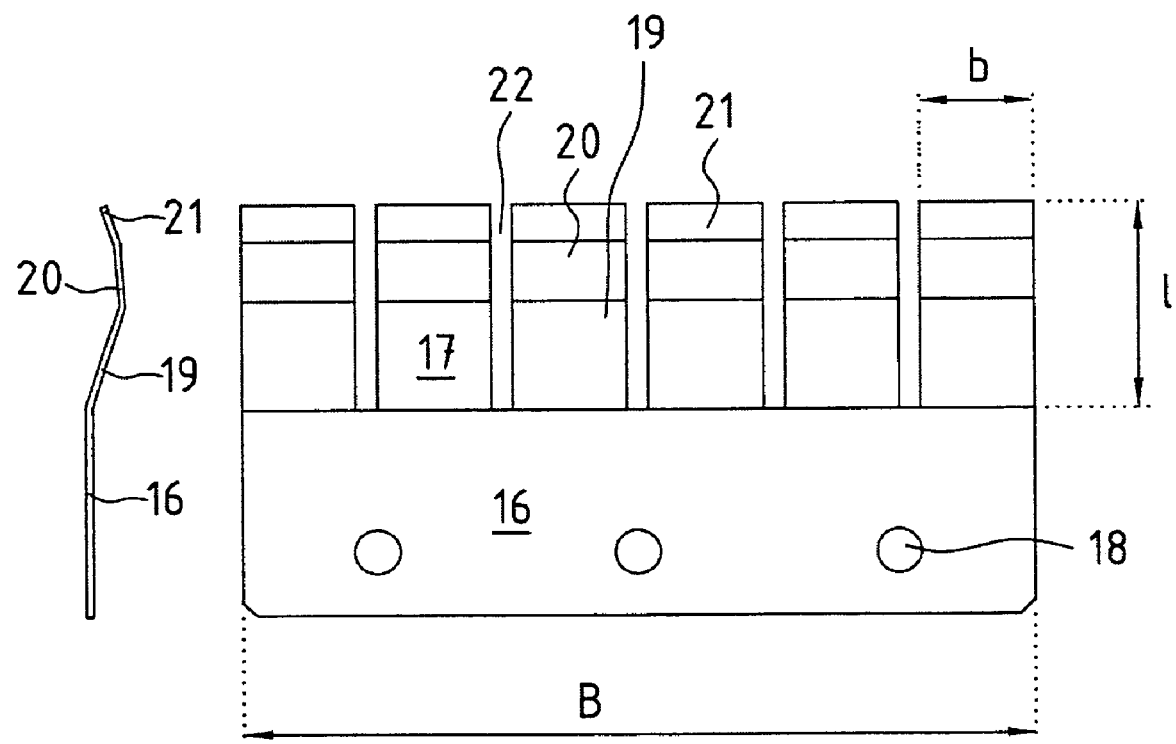
FIG. 3 shows one of two leaf springs of the spring means in a top view and in a side view.

In the area of the spring section following the fastening section 16, the leaf spring is bent—as seen in FIGS. 2 and 3—downwardly to the edges of the printed circuit boards 1. In its cross-section, the leaf spring has the form of a flat V which is formed by one first, longer section 19 extending downwardly and by two shorter sections 20, 21 extending upwardly. Of the upwardly extending sections 20, 21, the second section 21 is shorter and extends somewhat more steeply upwardly.

The invention is not limited to this shape of the leaf springs, however. The spring elements 17 of the leaf spring can also be bent in Z-shape or S-shape.

The spring elements 17 of the spring section are separated from each other by elongated gaps 22 extending parallel to the printed circuit boards 1. The spring elements 17 are thus formed by extensions of the fastening section 16 which are separated from each other and which are bent, as described above, in the form of a flat V towards the edges of the printed circuit boards 1. The width of the gaps, i.e. the spacing of the spring elements 17, is approximately 0.5 to 3 mm.

This design of the leaf spring allows to provide not only one component with a fastening section 16 and a spring section, but also separate spring elements 17, i.e. spring elements 17 acting independently of each other.

The leaf spring can be made of brass and have a gauge of 0.6 to 1.2 mm. It is simple to produce from an appropriate brass sheet.

The fastening section 16 of the leaf spring is arranged between the guiding strip 13 and the upper housing part 5 and fastened together with the guiding strip 13 on the upper housing part 5. To this end, the openings 18 of the fastening section 16 are in alignment with the openings 15 of the guiding strip 13. That means, one leaf spring and one guiding strip 13 form one joint arrangement fastened to the upper housing part 5. Manufacturing and installation expenditures can thus be kept low.

The electronic device of this embodiment comprises two such arrangements of a leaf spring and a guiding strip 13 which are fastened spaced apart in the upper housing part 5 and which are seated, in built-in condition, on the upper edges of the printed circuit boards 1.

The electronic device comprises a connecting part 23 by means of which a detachable electronic connection can be provided to another electronic device, namely a camera. The connecting part 23 connects to the lower housing part 4, i.e. to the housing part with the plug-in connections. Thus, an electronic connection to the camera can be provided in a direct manner.

Alternatively, the leaf springs can also have a different shape, e.g. merely a bend towards the upper edges of the printed circuit boards 1.

It is essential that force is applied by the spring means to at least all printed circuit boards 1 with plug-in connections, for the boards thus being pressed into the plug-in connections.

What is claimed is:

1. Electronic device comprising:
   a housing;
   printed circuit boards, wherein a plurality of printed circuit boards are connected with a housing part on one edge each by at least one electronic plug-in connection;
   guiding means, wherein the printed circuit boards are kept parallel to each other in the housing by the guiding means; and
   spring means, which apply force to the printed circuit boards and press them into their respective plug-in connections, wherein the spring means comprise at least one leaf spring with a fastening section and with a spring section which is subdivided into separated spring elements, and wherein a spring element is provided for each printed circuit board with a plug-in connection.

2. The electronic device according to claim 1, wherein the spring means are fastened to the opposite housing part.

3. The electronic device according to claim 1, wherein the guiding means are arranged on the opposite edges of the printed circuit boards.

4. The electronic device according to claim 3, wherein the guiding means are fastened to the opposite housing part.

5. The electronic device according to claim 3, wherein the guiding means comprise at least one guiding strip provided with grooves for the printed circuit boards.

6. The electronic device according to claim 5, wherein the fastening section of the leaf spring is fastened together with the guiding strip on the opposite housing part.

7. The electronic device according to claim 6, wherein two spaced apart arrangements of a leaf spring and a guiding strip are provided.

8. The electronic device according to claim 1, wherein the connecting part is provided by means of which a detachable electronic connection can be provided to another electronic device.

9. The electronic device according to claim 1, which is designed as a recording device.

10. The electronic device according to claim 9, which is designed as a detachable recording device for a camera.

* * * * *